March 3, 1964 J. FUTTERMAN 3,123,780

HIGH FIDELITY AMPLIFIER

Filed Sept. 15, 1960 4 Sheets-Sheet 1

INVENTOR.
JULIUS FUTTERMAN
BY Darby & Darby
ATTORNEYS

March 3, 1964 J. FUTTERMAN 3,123,780

HIGH FIDELITY AMPLIFIER

Filed Sept. 15, 1960 4 Sheets-Sheet 2

INVENTOR.
JULIUS FUTTERMAN

BY Darby + Darby
ATTORNEYS

March 3, 1964 J. FUTTERMAN 3,123,780

HIGH FIDELITY AMPLIFIER

Filed Sept. 15, 1960 4 Sheets-Sheet 3

INVENTOR.
JULIUS FUTTERMAN

BY Darby & Darby

ATTORNEYS

March 3, 1964 J. FUTTERMAN 3,123,780

HIGH FIDELITY AMPLIFIER

Filed Sept. 15, 1960 4 Sheets-Sheet 4

INVENTOR.
JULIUS FUTTERMAN

BY Darby & Darby
ATTORNEYS

United States Patent Office 3,123,780
Patented Mar. 3, 1964

3,123,780
HIGH FIDELITY AMPLIFIER
Julius Futterman, 523 W. 112th St., New York, N.Y.
Filed Sept. 15, 1960, Ser. No. 56,157
13 Claims. (Cl. 330—74)

This invention relates to amplifiers and more particularly to a high-fidelity, high power amplifier of the series-connected, push-pull type useful for directly driving low impedance loads.

Perhaps the most common type of push-pull amplifier is the parallel type wherein a pair of parallel-connected electron space-discharge devices or "tubes" is employed in the output stage to alternately drive the load. While push-pull amplifiers of this type provide large amounts of output power, they have a three-terminal output which necessitates the use of an output transformer for coupling the output of the amplifier to the usual two-terminal load. A good output transformer is expensive and inherently produces switching transients when the amplifier is worked class AB or class B, due to the leakage reactance in the transformer. This type of distortion cannot be eliminated by the use of negative feedback. Additionally, the output transformer causes a phase shift in the output signal at both low and high frequencies which limits the amount of overall negative feedback that can be employed in an amplifier to reduce both distortion and hum level in the output load. From a practical standpoint, the reduction of hum level by the use of large amounts of overall negative feedback reduces the cost of manufacture of the amplifier because an inexpensive type of power supply having a high "ripple" factor may be utilized.

In order to avoid the above difficulties with the parallel type of push-pull amplifier, a series-connected type of push-pull amplifier has been developed comprising a pair of similar output tubes, referred to as the "upper" tube and the "lower" tube. The anode of the upper tube is connected to the positive side of an anode voltage supply source and the cathode of the lower tube is connected to the negative side of the supply which is usually at ground potential. The anode of the lower tube is connected to the cathode of the upper tube and this circuit junction is coupled to the output load. The other side of the load is normally at ground potential. This type of push-pull amplifier provides a two-terminal output, thereby eliminating the necessity of employing an output transformer. Additionally, this amplifier has a low output impedance, which makes it especially valuable for driving low impedance loads, such as the voice coil of a loudspeaker, for example. Although an impedance-matching transformer may be required under some circumstances, the cost of this component does not approach that of the output transformer required in the parallel type of push-pull amplifier. The elimination of the output transformer permits the use of reasonably large amounts of overall negative feedback, without instability, to provide the low distortion and hum level required in high-fidelity power amplifiers.

Although the series-connected type of push-pull amplifier constitutes a major advance over the parallel-connected type of push-pull amplifier, two major problems have been found to exist in the series-connected type. The first problem arises when series-connected screen-grid tubes are employed as the output stage of the amplifier. Screen-grid tubes are most often used in the output stage of amplifiers to provide large amounts of output power, since they have a much higher anode circuit efficiency than triodes. Furthermore, when screen-grid tubes are employed to feed low impedance loads, the screen-grid voltage can be considerably higher than the anode voltage, which additionally increases anode circuit efficiency. This fact, which is known to those skilled in the art, makes their use especially desirable in high-fidelity amplifiers feeding low impedance loads, such as the aforementioned voice coils, for example. In order to provide maximum output with low distortion over a wide frequency range, however, the voltage between the screen-grid and the cathode of each output tube must be maintained substantially constant. A typical push-pull amplifier when operated class AB, and delivering a maximum output, will have a screen-grid current of over ten times the quiescent or no signal current. The application of a suitable screen-grid voltage supply to the lower tube of the series-connected output tubes presents no problem, since the screen-grid can be connected to a low impedance source which provides a very small voltage drop as the screen current increases under signal drive, to thereby produce only a small change in the screen-grid to cathode voltage. The upper tube of the series-connected output tubes presents a problem however, since it has both the load and the lower tube in its cathode circuit, and therefore functions as a cathode-follower. If the upper tube had its screen-grid connected to a low impedance source of voltage, the source would be in parallel with the output and would therefore short-circuit the load.

One prior art solution has been to employ either a resistor or a choke in the positive voltage feed to the screen-grid, and then to bypass the screen-grid to the cathode with a large capacitor. Unfortunately, since the resistor or choke is then in parallel with the load, it cannot be too small in value or it will be wasteful of output power. A large choke, moreover, is expensive while the use of a large value resistor reduces the screen-grid voltage under signal drive, to thereby destroy the balance of the output stage and so increase distortion and reduce power output. The use of a choke and capacitor would also cause a serious phase shift in the output signal at low frequencies, which becomes significant when overall negative feedback in the amplifier is employed. Furthermore, the bypass capacitor necessary with this solution is not effective at very low frequencies so that at these frequencies the screen-grid to cathode voltage is not maintained constant. Accordingly, the prior art solution to the problem of supplying the screen-grid voltage to the upper tube in a series-connected type of push-pull amplifier has not been satisfactory for high-fidelity, high power amplifiers, which must, of necessity, operate over a wide range of frequencies and must employ large amounts of overall negative feedback.

Another suggested solution to the problem of maintaining constant the screen-grid to cathode voltage of the upper tube has been to provide a separate floating D.C. voltage supply, but this means has also proven unsatisfactory because such a supply, to be effective, would be of low impedance and so unavoidably have considerable capacitance to ground which would be in parallel with the output load. Still another suggested solution involves the use of shunt type regulators such as gaseous voltage regulator tubes or Zener diodes. This method is also unsatisfactory as the regulator element would need to carry at least the maximum current required by the screen-grid of the upper tube at full output. This current in class AB or class B operation is over ten times the static screen-grid current, as was heretofore mentioned, and as this current would have to flow through the anode-cathode discharge path of the lower tube it would constitute a large part of this tube's static current and so upset the balanced operation of the series-connected push-pull output stage. This will be quite evident to those skilled in the art.

The second problem arising in the series-connected type of push-pull amplifier is that of providing equal drive to the upper and lower series-connected output tubes. The load, as was shown before, is coupled to the anode-cathode circuit junction of the tubes and to signal ground. If the input signal to the upper tube is applied between its control-grid and ground then it would operate as a cathode-follower, that is, the signal voltage developed across the load would oppose the input signal. A signal applied to the lower tube between its control-grid and ground however, would not be opposed by the signal voltage across the load. Consequently, there would not be equal drive to the output tubes and balanced operation would thus not be obtained resulting in increased distortion and a decrease in power output.

One known solution for this latter problem has been to increase the signal drive to the upper tube in order to compensate for the opposing signal developed across the load. This method is only satisfactory if the load is resistive. However, the load is usually reactive in character, such as the aforementioned loudspeaker voice coil, and its impedance varies with frequency so that the voltage developed across it would also change with the frequency of the input signal and equal drive would not be obtained. Another solution employs a driver transformer having a pair of secondary windings, so that both the upper and lower tubes can be driven between cathode and control-grid by the respective windings. Still another known solution to the problem employs a tube, usually a triode, in the well known phase-splitter circuit configuration. Equal cathode and anode load resistors are connected respectively to the cathode and anode of the phase-splitter tube. The other end of the cathode resistor is connected to ground. The control-grid of the lower tube is coupled to the cathode of the phase-splitter so that the signal voltage developed across the cathode resistor is applied between the control-grid and cathode of the lower tube. The anode of the phase-splitter is coupled to the control-grid of the upper output tube and the other end of the anode resistor is connected to the anode-cathode junction of the series-connected output tubes. By this means, the signal voltage developed across the anode resistor of the phase-splitter which is equal to, but of opposite phase, to that developed across the cathode resistor is applied between the control-grid and cathode of the upper tube. While this arrangement provides equal drive for the upper and lower tubes, it is unsatisfactory for amplifiers required to have a large power output with good efficiency. To meet these conditions, the output stage should be operated class AB or class B, which requires large driving voltages from the phase-splitter tube. Since the anode resistor of the phase-splitter is connected to the anode-cathode junction of the series-connected output tubes, the anode supply voltage for the phase-splitter tube is limited to about one half of the available supply voltage applied across the series-connected output tubes. The maximum drive voltage obtainable from the phase-splitter is directly proportional to the anode voltage applied to this tube, so that the voltage available at the anode-cathode circuit junction is insufficient to provide adequate drive for the required class AB or class B operation. Furthermore, the fact that the output load is in the anode to cathode circuit of the phase-splitter also serves to materially decrease the amount of drive voltage available from this tube. In order to obtain a higher anode voltage for the phase-splitter tube, it has been suggested to remove the anode resistor from the junction of the series-connected output tubes and connect it to a source of higher voltage such as the anode supply voltage for the output tubes. Unfortunately, this supply voltage source is necessarily at signal ground potential, so that its use would destroy the equal drive to the output tubes. To prevent this, a resistor or choke is inserted in series with the anode resistor of the phase-splitter tube and the anode resistor is bypassed with a capacitor to the anode-cathode circuit junction of the series-connected output tubes. By virtue of this arrangement, for signal voltages, the anode resistor of the phase-splitter is still coupled to the anode-cathode circuit junction of the series-connected output tubes to thereby provide equal drive for these tubes while still obtaining the benefit of a higher potential source for the phase-splitter tube.

This last described arrangement for providing equal drive to series-connected push-pull output tubes has generally proven unsatisfactory. For the low frequency signals, where the reactance of the bypass capacitor can not be neglected, equal drive is not obtained and it can be readily seen that for very low frequency signals the drive to the upper output tube is mainly between its control-grid and ground thus destroying the balance of the output stage. Moreover, the reactance effects of the capacitor and also the choke, if one is used, causes a phase shift in the output signal that becomes serious when a substantial amount of overall negative feedback is employed in the amplifier. In a high power amplifier wherein the output stage is operated class AB or class B the power supply must have good regulation. To be economical to manufacture such a supply would of necessity have a high percentage of ripple. If however, we can utilize a high amount of overall negative feedback, of the order of 40 db or more in the amplifier, then this ripple can be reduced in the output load to that equivalent to a very expensive power supply. Additionally, with this amount of feedback, distortion of the output signal will be reduced to negligible proportions. In order to achieve this high degree of negative feedback, over the desired frequency response, without instability, it is necessary to control the complete amplifier response several octaves below and above the desired frequency response of the amplifier. For a high-fidelity audio amplifier this response would typically be from 20 cycles to 20,000 cycles and it would have to be controlled from a fraction of a cycle to several hundred kilocycles in order to avoid instability. The difficulties involved with the prior art arrangements for employing series-connected, push-pull output tubes in a high power, high-fidelity amplifier are successfully solved by, what is believed to be, new and novel means and which forms the basis of the invention to be hereinafter described.

Accordingly, it is an object of this invention to provide a high-fidelity, high power amplifier of the series-connected, push-pull type which possesses a wide frequency response range and which is suitable for supplying low impedance loads.

It is a further object of this invention to provide a high-fidelity, high power amplifier of the series-connected, push-pull type which has low output distortion and which may employ relatively inexpensive power supplies.

It is a still further object of this invention to provide a novel arrangement for supplying screen-grid voltage to the screen-grids of series-connected, screen-grid output tubes in a series-connected, push-pull amplifier.

It is an additional object of this invention to provide novel means for assuring equal drive of the series-connected output tubes in a series-connected, push-pull amplifier when electron tube devices are used to provide the input signal.

Briefly, the amplifier of the invention employs series type electronic voltage regulator means to maintain a constant screen-grid to cathode voltage for at least the upper tube of the series-connected output tubes. The screen-grid to cathode voltages are maintained constant despite load variations and variations in signal amplitude and frequency, so that maximum power output is obtained over an extremely wide range of frequencies. By utilizing series type electronic voltage regulator means to supply the screen-grid voltages for the output tubes, large amounts of negative feedback may be employed, so that relatively inexpensive power supplies having a high ripple factor may be used in the amplifier. Additionally, the use of series type electronic voltage regulator means for keeping the screen-grid to cathode voltage of the upper tube constant does not involve shunting the output load with resistive or reactive components. These series type voltage regulators means do not of course include shunt type regulators such as gaseous voltage regulator tubes or Zener diodes which are unsatisfactory as hereinbefore explained.

Both series and shunt type electronic regulator circuits are employed to provide a constant voltage output to a load. However, as is known to those skilled in the art, significant differences exist between the two types of circuits. In a series type electronic voltage regulator circuit a variable resistance element, usually in the form of a vacuum tube or transistor, is placed in series between one terminal of the supply voltage and one terminal of the load. Changes in the load voltage are sensed by a control element, usually in the form of another vacuum tube or transistor, and these changes are amplified and used as a control signal to bias the variable resistance element. As the variable element is driven further into conduction by the control signal, its resistance decreases. This causes less voltage to be dropped across the element and makes more voltage available to the load. Conversely, as the control signal drives the variable element toward cut-off, its resistance increases producing a higher voltage drop and making less voltage available to the load.

In a shunt type voltage regulator, the regulator element such as a gas tube or Zener diode, is connected in parallel across the load being regulated. In this type of circuit the voltage drop across the regulator element remains substantially constant at the designed voltage reference level over a fairly wide range of current passing through the tube or diode. If one end of a shunt regulator element is to be connected to another portion of a circuit then that portion will receive the current flowing through the element. For a more detailed description of series and shunt regulator circuits, reference is made to "Electron Tube Circuits" by Seely, McGraw-Hill, 1950, pages 306–316.

Equal drive for the series-connected output tubes is obtained by using the same or similar electronic voltage regulator means to couple the anode load resistor of a phase-splitter tube to the anode-cathode circuit junction of the series-connected output tubes. By connecting a regulated voltage, which remains constant irrespective of frequency, amplitude, or load change between the anode-cathode circuit junction of the series-connected output tubes and the anode load resistor of the phase-splitter tube, a high anode voltage may be supplied to the phase-splitter, with the result that large driving voltages from the phase-splitter may be obtained to achieve high power output without incurring the prior art disadvantage of losing equal drive to the series-connected output tubes at the all-important lower frequencies. Again, this permits the use of large amounts of overall negative feedback, without instability, which is necessary for the construction of an economical, high-fidelity, high power amplifier.

Figure 3:
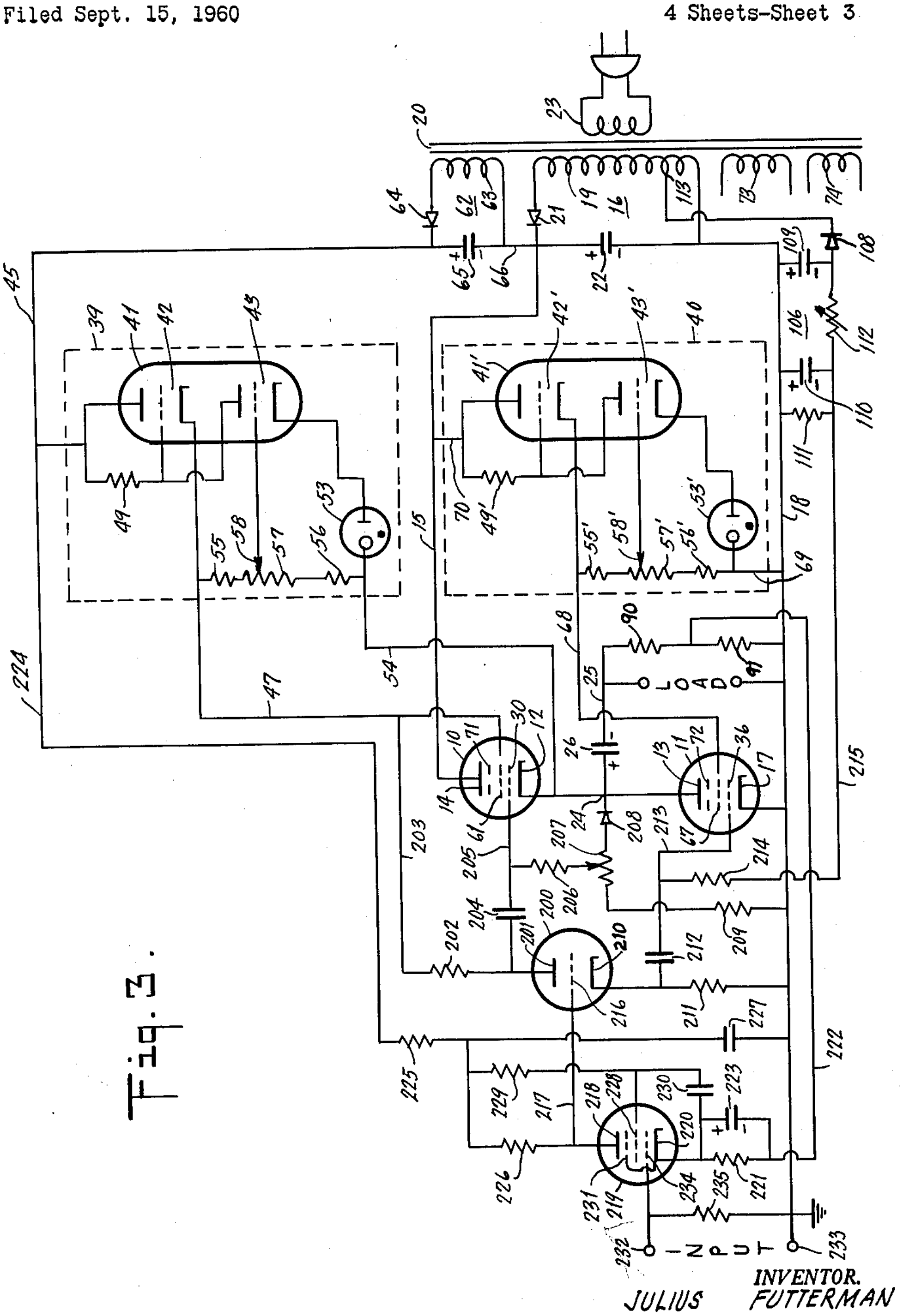
Figure 4:
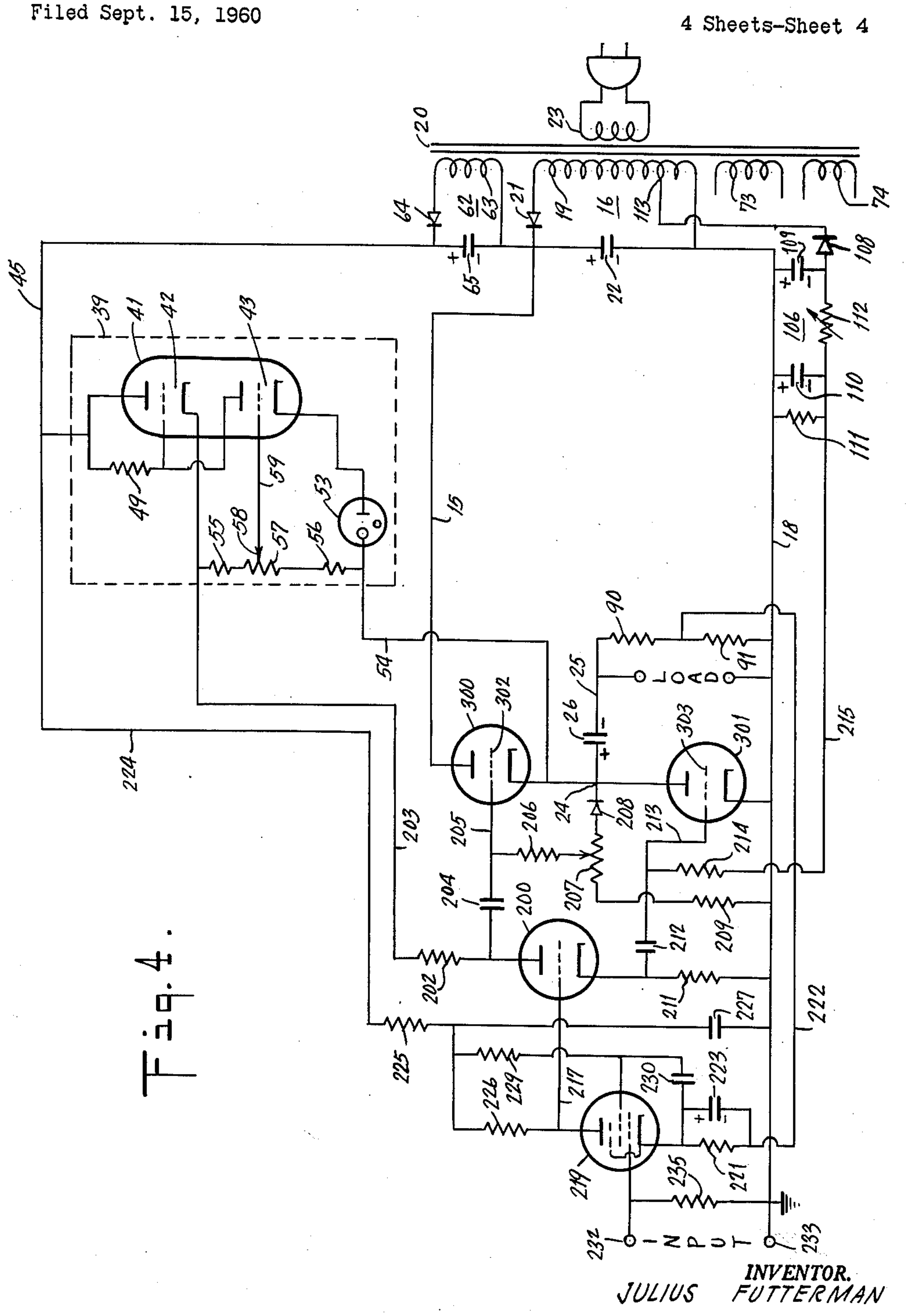

FIG. 3 is a schematic circuit diagram of a complete series-connected, push-pull amplifier embodying the teachings of the invention and employing electronic voltage regulator means to maintain constant the screen-grid to cathode voltages of the output tubes and to provide equal drive for the output tubes from a phase-splitter circuit; and FIG. 4 is a schematic circuit diagram of a series-connected, push-pull amplifier employing triodes as the output tubes with a phase-splitter type of driver circuit and an electronic voltage regulator to provide equal drive.

Figure 1:
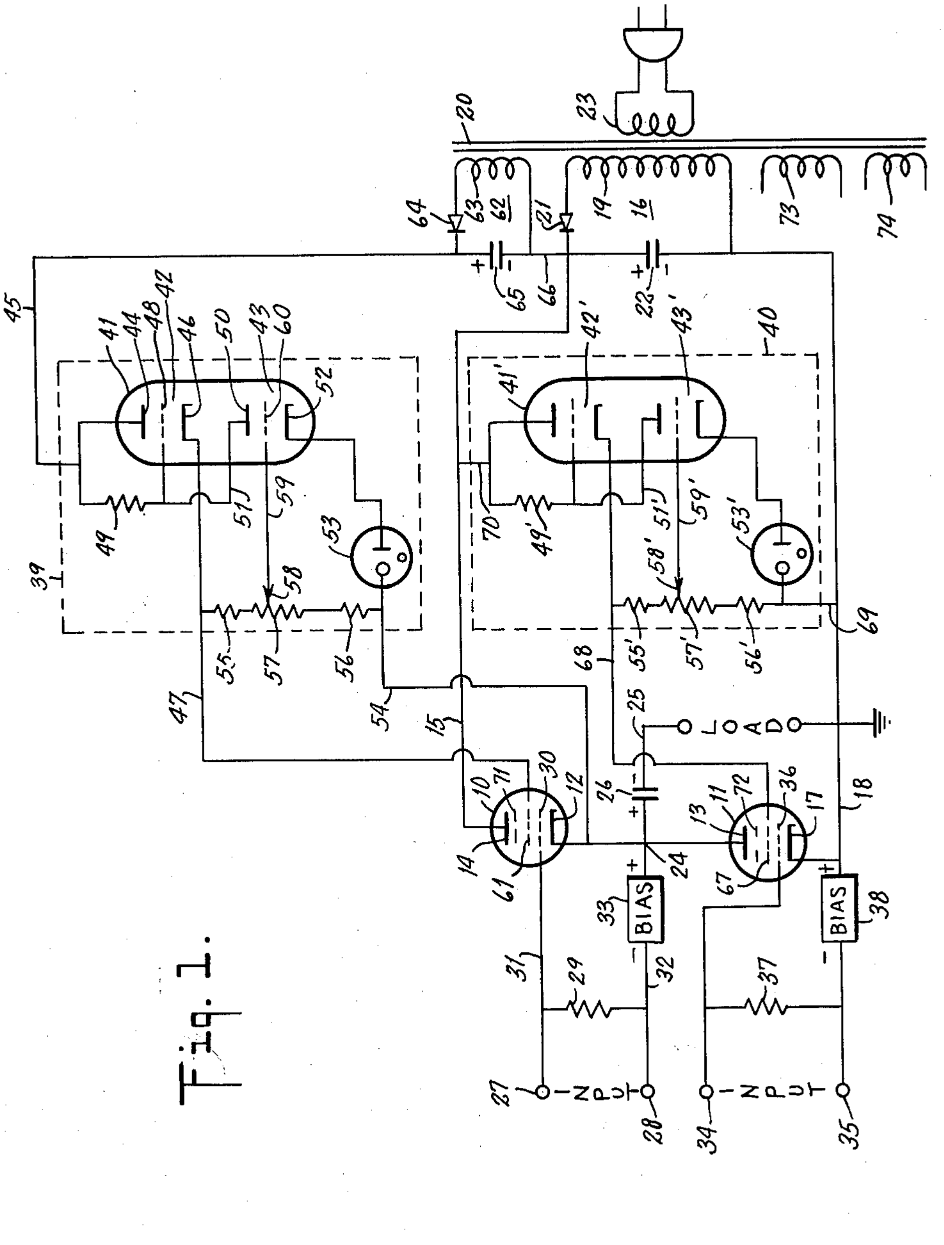
FIG. 1 is a schematic circuit diagram of the output stage of a series-connected, push-pull amplifier embodying the teachings of the invention and employing a pair of electronic voltage regulators to maintain constant the screen-grid to cathode voltages of the screen-grid output tubes.

Referring now to FIG. 1 of the drawings, there is shown a series-connected, push-pull amplifier output stage comprising screen-grid output tubes 10 and 11. The anode-cathode voltage of each of these two output tubes are substantially equal in magnitude and the manner of accomplishing this will be hereinafter described. The tubes are connected in a series-circuit with the cathode 12 of the upper tube 10 being directly connected to the anode 13 of the lower tube 11. The anode 14 of tube 10 is connected by a lead 15 to the positive side of a low impedance anode voltage supply source, indicated generally as 16, while the cathode 17 of the lower tube 11 is connected by a lead 18 to ground and to the negative side of this supply. The anode voltage supply source 16 comprises a secondary winding 19 of a power supply transformer 20, a rectifier 21, which may be of the silicon type, for example, and a storage capacitor 22. A primary winding 23 of the transformer is adapted to be connected to an alternating current supply source, as the usual household supply. The load for the amplifier, which may be the voice coil of a loudspseaker, for example, is coupled between ground and the anode-cathode circuit junction 24 of the series-connected output tubes 10 and 11 by means of a lead 25 and a coupling capacitor 26.

In order to provide equal drive for the tubes 10 and 11 to assure maximum power output and low distortion, the input signals for the tubes are applied between the control grid and the cathode of each tube. The input signal for tube 10 is applied to input terminals 27 and 28 which are connected to the ends of input resistor 29. One end of the input resistor 29 is coupled to the control-grid 30 of tube 10 by a lead 31, while the other end of the resistor is coupled to the cathode 12 of the tube by means of a lead 32 and a negative bias supply source, indicated generally as 33. The signal for the lower tube 11 is applied to input terminals 34 and 35 which are respectively connected to the control-grid 36 and the cathode 17 of tube 11. Input resistor 37 and negative bias supply source, indicated generally as 38 are provided in the same manner as for the upper tube, between the cathode and the control-grid. The input signal required to drive the series-connected, push-pull amplifier must be a push-pull signal comprising two components of equal magnitude but opposite in phase, so that tubes 10 and 11 alternately conduct to energize the load in the well known manner of push-pull amplifiers. Usually a phase inverter amplifier, such as the aforementioned phase-splitter circuit, for example, is employed to provide the push-pull input signal for the amplifier from a single-ended input signal. In any event, the signal voltage applied to tube 10 must be of substantially the same magnitude but opposite in phase to the signal voltage applied to tube 11 if the tubes are to alternately conduct with balanced operation to provide maximum output power and low distortion.

The screen-grid to cathode voltage of output tubes 10 and 11 are maintained substantially constant in magnitude by a pair of electronic voltage regulators, indicated generally as 39 and 40. Regulator 39 may comprise a dual type tube 41 having twin triode portions 42 and 43, which respectively act as a series regulator tube and as an amplifier tube. The series regulator triode 42 has its anode 44 connected to an input lead 45 and its cathode 46 connected to an output lead 47. The control-grid 48 of the series regulator triode is connected to the anode 44 through a resistor 49 and to the anode 50 of the amplifier triode 43 by a lead 51. The cathode 52 of the amplifier triode is connected through a voltage reference element 53, such as the neon lamp illustrated, for example, to the common input-output lead 54. Resistors 55 and 56 and potentiometer 57 are serially connected between the output lead 47 and the common input-output lead 54. The resistance presented by the series regulator triode is controlled by the amplifier triode 43 in accordance with the output voltage signal sensed by resistors 55 and 56 and potentiometer 57 compared to a standard or reference voltage appearing across the neon lamp 53. Since the detailed mode of operation of electronic voltage regulators of this type is believed to be well known, it will not be described further herein, except to note that regulators of this type are extremely rapid in operation and may have an accuracy of the order of 1%. In practice, the dual tube 41 may comprise a type 6DR7, for example, while the neon lamp may be a type NE–2. The magnitude of the regulated output voltage appearing between leads 47 and 54 may be adjusted by positioning the movable tap 58 of potentiometer 57.

The positive lead 47 of the regulator 39 is directly connected to the screen-grid 61 of output tube 10, while the common input-output lead 54 is directly connected to the cathode 12 of the same tube. The input lead 45 of the regulator 39 is connected to the positive side of a direct current supply source, indicated generally as 62, which comprises a secondary winding 63 of power supply transformer 20, a silicon rectifier 64 and a capacitor 65. The negative side of the D.C. supply source 62 is connected by a lead 66 to the positive side of anode voltage supply source 16, so that the potential appearing at input lead 45 with respect to ground is equal to the sum of the voltages appearing across supply sources 16 and 62. When the output tubes 10 and 11 are beam pentode type 6DQ6B, for example, the voltage across direct current supply source 62 may be of the order of 200 volts and the voltage across anode supply source 16 may be about 330 volts, so that output tubes 10 and 11 will each have an anode-cathode voltage of 165 volts, and the voltage applied to the input terminal 45 and the common input-output terminal 54 of voltage regulator 39 is approximately 365 volts. The movable tap 58 of potentiometer 57 is adjusted to maintain a screen-grid to cathode voltage for the tube 10 of about 250 volts. Accordingly, it may be noted that the screen-grid is maintained at a substantially higher voltage than the anode for the output tube 10, so that the tube will operate with maximum anode circuit efficiency. It should be understood that the ratio of anode to screen-grid voltage of output tubes 10 and 11 is not a fixed value but rather depends on the impedance of the output load and also on the maximum power output of the amplifier. This will be evident to those skilled in the art.

The screen-grid 67 of the lower, series-connected output tube 11 is connected by a lead 68 to the positive output side of electronic voltage regulator 40, which may be identical in construction to the voltage regulator 39. The other side of the output of voltage regulator 40 is connected by leads 69 and 18 to ground, so that the regulated output voltage from the regulator 40 is directly applied between the screen-grid and the cathode of the lower tube 11. The input to the regulator 40 is provided by leads 70 and 15 which connect to the positive side of anode voltage supply source 16, and again the movable tap 58′ on the potentiometer 57′ of regulator 40 is adjusted to provide a regulated output voltage of approximately 250 volts between the screen-grid and cathode of tube 11. In order to insure equality of the anode-cathode voltages of output tubes 10 and 11 their screen-grid voltages can be varied slightly to accomplish this, that is, the output tube whose anode-cathode voltage is higher in magnitude can have its screen-grid voltage increased by means of the potentiometer 57 or 57′ as the case may be. Although not illustrated, it will be understood that the beam forming electrode or suppressor-grid 71 and 72 of output tubes 10 and 11 are connected to their respective cathodes in the usual manner. Finally, secondary windings 73 and 74 of power supply transformer 20 are provided to energize the heater elements of the tubes in the amplifier, which again have not been illustrated for the purpose of simplification.

In operation, the electronic voltage regulators 39 and 40 maintain the screen-grid to cathode voltage of the output tubes 10 and 11 at a substantially constant value, irrespective of changes in input signal magnitude and frequency. This permits the output tubes to operate at maximum anode circuit efficiency and to provide the required large power output needed for modern high-fidelity amplifiers. Furthermore, the use of electronic voltage regulators to maintain the screen-grid to cathode voltage constant does so without causing any phase shift of the output signal at low frequencies and avoids the use of bypass capacitors, expensive choke components and the like and does not constitute a power drain on the amplifier output, as found in many of the prior art arrangements, for example. It will be understood, of course, that the single output tubes 10 and 11 illustrated could be replaced by a number of similar output tubes with their respective elements connected in parallel to provide a large power output. In this case, the electronic voltage regulators 39 and 40 could supply the screen-grid to cathode voltage for a number of such output tubes.

Figure 2:
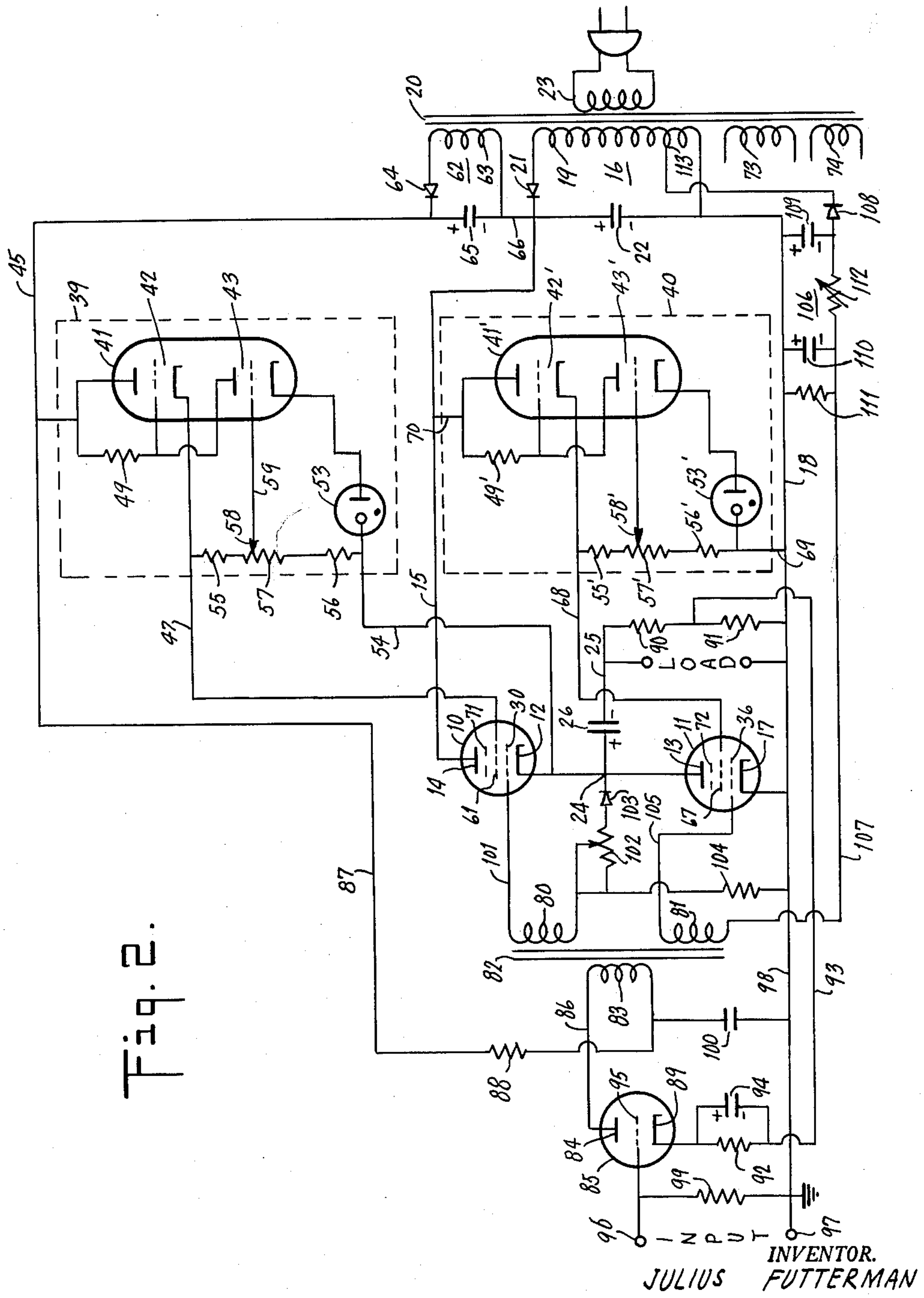
FIG. 2 is a schematic circuit diagram of a series-connected, push-pull amplifier similar to the amplifier of FIG. 1, with the addition of an input transformer to provide equal drive to the series-connected output tubes.

FIG. 2 of the drawings illustrates an amplifier circuit using the output stage of FIG. 1, with means added for equally driving the series-connected output tubes from a single-ended input source and for introducing overall negative feedback in order to minimize distortion and hum in the output load. In describing the amplifier of FIG. 2, the same reference numerals will be employed as used in FIG. 1 to designate the same elements. The push-pull input signals for driving the series-connected output tubes 10 and 11 are obtained from secondary windings 80 and 81 of an input or driver transformer 82. The primary winding 83 of the driver transformer has one end connected to the anode 84 of an input triode 85 by means of lead 86 and the other end connected to positive anode supply voltage lead 45 by means of a lead 87 and a filter resistor 88. The cathode 89 of the input tube 85 is connected to the circuit junction of a pair of resistors 90 and 91 by means of cathode resistor 92 and a lead 93. The cathode resistor 92 and the bypass capacitor 94 biases the input tube in the usual manner. By connecting resistors 90 and 91 in series across the load, the connection from the circuit junction of the resistors 90 and 91 to the cathode of the input tube introduces negative feedback from the output voltage appearing across the load terminals. The control-grid 95 of the input tube is connected to input terminal 96. A second input terminal 97, which may be at ground potential as illustrated, is connected to the cathode 17 of the series-connected output tube 11 by means of a lead 98. The usual input resistor 99 is shunted across the input terminals 96 and 97.

As thus far described, it is seen that the anode voltage supply for the input tube 85 is obtained from the total voltage appearing across D.C. supply voltage sources 16 and 62 through leads 45 and 87, filter resistor 88, primary winding 83 and lead 86. The cathode of the input tube is connected to the ground potential side of the power supply by means of resistor 92, lead 93, resistor 91 and lead 98. The signal path is completed in the anode circuit of the input tube 85 by a capacitor 100 which is connected between the lower side of primary winding 83 and ground. Accordingly, a single-ended input signal applied to the terminals 96 and 97 is amplified by tube 85 and applied to primary winding 83 of driver transformer 82. The signals appearing across similar secondary windings 80 and 81 of the driver transformer will be of equal magnitude but opposite in phase, to thereby form the required push-pull input signal for the series-connected output tubes 10 and 11. It is understood, of course, that secondaries 80 and 81 are phased so as to provide opposite signal voltages to control-grids 30 and 36. One side of secondary winding 80 is connected to the control-grid 30 of output tube 10 by means of a lead 101, while the other side is connected to the circuit junction 24 of the series-connected output tubes by means of a potentiometer 102 and a Zener diode 103, so that the input signal to tube 10 is applied between the control-grid and the cathode of the tube. A resistor 104 is connected in series-circuit with potentiometer 102 and diode 103 between ground and the circuit junction 24 of the output tubes, so that resistor 104, potentiometer 102 and Zener diode 103 form a voltage divider which acts as a source of negative grid bias for the output tube 10. The magnitude of this grid bias voltage may be varied slightly by adjustment of potentiometer 102. The advantage of using Zener diode 103 is that the voltage drop across it and hence the bias for tube 10 remains substantially constant despite the changes in potential at circuit junction 24 under signal drive. Secondary winding 81 has the upper end thereof connected to the control-grid 36 of output tube 11 by means of a lead 105 and the lower end thereof connected to a source of negative bias voltage, indicated generally as 106, by means of a lead 107. As illustrated, the negative bias supply source is formed by a rectifier 108, which may be of the semi-conductor type, capacitors 109 and 110 and resistors 111 and 112. Resistor 112 is made variable to permit adjustment of the magnitude of the negative bias applied. The alternating current input for the rectifier 108 is obtained by connecting the rectifier to a tap 113 on secondary winding 19 of the power supply transformer 20. By virtue of this arrangement, the signal appearing across secondary winding 81 of the driver transformer is applied between the control-grid and the cathode of tube 11, so that the input signal for each of the tubes 10 and 11 is applied in the same manner. Again, as in the arrangement of FIG. 1, the electronic voltage regulators 39 and 40 maintain the screen-grid to cathode voltages of the output tubes 10 and 11 substantially constant.

FIG. 3 of the drawings illustrates a series-connected, push-pull amplifier circuit employing screen-grid output tubes in the same manner as the amplifier circuits of FIGS. 1 and 2, but with a phase-splitter circuit driving the series-connected output tubes. In describing this amplifier circuit, the same reference characters will be employed as in FIGS. 1 and 2 for the same elements. The push-pull input signal for driving the control-grids 30 and 36 of the output tubes 10 and 11 is obtained from a phase-splitter tube 200, which may be a triode, such as a type 6S4, for example. The anode 201 of the phase-splitter tube is connected by an anode load resistor 202 and by leads 203 and 47 to the positive output side of the electronic voltage regulator 39. The anode 201 is also coupled by a capacitor 204 and a lead 205 to the control-grid 30 of the output tube 10. The control-grid 30 of the tube 10 obtains negative bias with respect to the cathode 12 of the tube by means of a grid resistor 206, a potentiometer 207, a Zener diode 208 and a voltage-divider resistor 209 in the same manner as the corresponding elements of FIG. 2. The cathode 210 of the phase-splitter tube 200 is connected to ground through a cathode load resistor 211 and to the control-grid 36 of output tube 11 through a coupling capacitor 212 and a lead 213. Anode and cathode load resistors 202 and 211 are equal in value. Negative grid bias is applied to the control-grid 36 from the negative bias voltage source 106 by means of grid resistor 214 and lead 215. The control-grid 216 of phase-splitter tube 200 is connected by a lead 217 directly to the anode 218 of an amplifier tube 219 which may comprise, for example, a high-transconductance pentode, such as type 6CB6. The cathode 220 of the amplifier tube 219 is connected by cathode resistor 221 and a lead 222 to the circuit junction of resistors 90 and 91 which form a feedback voltage divider shunting the load terminals of the amplifier. The cathode resistor 221 and the by-pass capacitor 223 bias the tube in the usual manner. The anode voltage for amplifier tube 219 is obtained from the positive side of the serially-connected voltage source 16 and 62 by means of leads 45 and 224, filter resistor 225 and anode resistor 226. A capicitor 227 is connected between the circuit junction of resistors 225 and 226 and ground, so that it forms with resistor 225 a filter for the anode and screen-grid voltage for the tube 219. The screen-grid 228 of the amplifier tube obtains its potential through voltage dropping resistor 229 and it is by-passed to the cathode 220 by capacitor 230 in the usual manner. The suppressor-grid 231 of the amplifier tube is connected to the cathode 220. Input terminals 232 and 233 of the amplifier are respectively connected to the control-grid 234 of the amplifier tube 219 and to the cathode 17 of the series-connected output tube 11, which is also at ground potential. Finally, the usual input resistor 235 is connected between ground and the control-grid 234.

From the foregoing description, it may be note that the anode load resistor 202 of the phase-splitter tube 200 is coupled between the control-grid 30 and the cathode 12 of output tube 10 through a circuit comprising lead 205, capacitor 204, leads 203 and 47, the output of the electronic voltage regulator 39 appearing across resistors 55, 56 and 57 and lead 54. Because of this, the anode 201 of the phase-splitter tube receives the high anode voltage available at the output of the electronic voltage regulator 39, which is essential, in order to provide the large signal votlages necessary to drive the output tubes 10 and 11 to maximum output, when they are operated class AB or class B, as heretofore explained. Unlike the prior art arrangements, this source of higher anode potential for the phase-splitter tube is obtained without the use of reactive components which shunt the load and thus cause a phase shift of the output signal and instability of the amplifier, when substantial amounts of overall negative feedback is used. With the arrangement described however, large amounts of overall negative feedback may be employed to minimize distoration and eliminate hum from the relatively inexpensive power supplies 16 and 62. Furthermore, the signal applied between the control-grid and cathode of output tube 10 is that developed across anode load resistor 202, since the output of electronic voltage regulator 39, which is connected between the anode load resistor 202 and the cathode of tube 10, does not develop any signal voltage. Also the signal applied between the control-grid and cathode of output tube 11 is that develop across cathode load resistor 211. Since the anode and cathode load resistors are of equal value, the signal voltages developed across them are also equal, but of opposite phase. As in the arrangement of FIG. 2, overall negative feedback is introduced by means of resistors 90 and 91 and lead 222 to the cathode 220 of the input amplifier tube 219. It should be pointed out that the electronic voltage regulator 39 serves the dual function of maintaining the screen-grid to cathode voltage constant for tube 10 and of permitting equal drive for the output tubes to be obtained.

In order to better understand the operation of the amplifier of FIG. 3, it will be assumed that the positive half of a square-wave signal sufficient to drive the amplifier to maximum output is applied to input terminals 232 and 233. This signal causes the control-grid of amplifier tube 219 to become less negative with respect to its cathode, so that a greatly amplified signal is developed at the anode 218 of the tube. This signal at the anode 218 is negative with respect to ground. As this signal also appears at the control-grid 216 of phase-splitter tube 200, it will decrease the anode-cathode current of the phase-splitter tube, so that the decrease in current through the cathode load resistor 211 will make the control-grid of output tube 11 more negative with respect to ground, and therefore raise the potential at the circuit junction 24 in the positive direction. At the same time, the decrease in current through the anode load resistor 202 of the phase-splitter tube will make the control-grid of output tube 10 less negative with respect to its cathode and will therefore further raise the potential of junction 24 in the positive direction. Since a maximum square-wave signal has been assumed, then in class AB or class B operation of the output stage, the output tube 11 would be cut-off and the output tube 10 would be operating at zero bias and would therefore have a very low anode to cathode impedance. Since junction 24 now has a higher positive potential with respect to ground than existed before the application of the square-wave signal, it will cause a charging current to flow through the anode-cathode impedance of output tube 10, coupling capacitor 26 and the load to thereby develop a positive voltage with respect to ground across the load. A portion of this voltage is fed back through lead 222 to the cathode 220 of amplifier tube 219 to oppose the signal voltage at the input terminals 232 and 233. By this means, overall negative feedback is obtained. Since the lower side of the output of electronic voltage regulator 39 is also connected to the junction 24 by means of lead 54, the rise in potential with respect to ground at the junction 24 will tend to decrease the output voltage of the electronic voltage regulator. This rise however is counteracted by the action of the regulator in the manner previously explained, so that the positive output appearing at lead 47 from the regulator rises to thereby maintain the output voltage substantially constant. Accordingly, there is no signal voltage developed between the upper end of the anode load resistor 202 and the cathode 12 of the upper output tube 10. Also, the signal voltage developed to drive both output tubes 10 and 11 is equal in magnitude but opposite in phase, so that equal drive is produced. When the square-wave input signal to the input terminals 232 and 233 goes negative, the above action is reversed, so that output tube 10 is now cut-off and output tube 11 is working at zero bias. Coupling capacitor 26 will then discharge through the anode-cathode impedance of output tube 11 and the load to thereby produce a signal voltage across the load which is negative with respect to ground. Again, a portion of this signal is fed back to the input of the amplifier by means of lead 222. At the same time, the positive voltage with respect to ground at the junction 24 becomes lower, so that the output voltage of the electronic voltage regulator 39 tends to increase. This effect is again counteracted by the action of the regulator to produce a lowered positive potential at the upper side of the regulator output at lead 47.

It may be noted that the anode-cathode discharge path of output tube 11 carries the screen-grid current of output tube 10, the current through resistors 55, 56 and 57 and also the anode-cathode current of amplifier control tube 43. Since these additional currents are small in comparison to the main anode-cathode current of tube 11 they have little practical effect on the amplifier operation. However, if desired, the anode-cathode current of output tube 10 may be increased to balance that of tube 11 by a suitable choice of circuit elements 207, 208 and 209.

In a typical amplifier constructed according to FIG. 3, output tubes 10 and 11 each consisted of three type 6DQ6B, phase-splitter tube 200 a type 6S4, voltage amplifier tube 219 a type 6CB6, tubes 41 and 41′ type 6DR7, voltage reference elements 53 and 53′ type 5651 tubes. Anode load resistor 226 was 1.8 megohms and the screen-grid voltage of tube 219 was adjusted so that the voltage drop across cathode load resistor 211 was approximately 100 volts. Cathode and anode resistors 211 and 202 were each 22,000 ohms, capacitors 204 and 212 were each 0.47 mfd. Power supply 16 delivered 330 volts and power supply 62 delivered 200 volts. The grid bias on output tubes 10 and 11 was approximately 40 volts and the screen-grid voltage 250 volts. The feedback resistors 90 and 91 were 750 and 68 ohms respectively, which resulted in approximately 40 db of overall negative feedback and a voltage gain of twelve, that is, a one volt signal applied to the input terminals 232 and 233 produced twelve volts across the output load. When driving a 16 ohm loudspeaker the power output was 40 watts with less than 0.1% harmonic distortion over the frequency range of 20 to 20,000 cycles. The signal to hum and noise ratio was 85 db below maximum output.

FIG. 4 of the drawings illustrates an amplifier circuit similar in all respects to the amplifier circuit of FIG. 3, except that triode tubes 300 and 301 have been respectively substituted for the pentode output tubes 10 and 11. The reference numerals employed in FIG. 3 are used in FIG. 4 to designate the same elements. The control-grids 302 and 303 of the respective triodes 300 and 301 are driven in the same manner as the control-grids 30 and 36 of the pentodes 10 and 11 in FIG. 3. Since the triodes 300 and 301 do not have screen-grids, the electronic voltage regulator 40 of the amplifier of FIG. 3 may be eliminated and the electronic voltage regulator 39 has its output connected only to the anode load resistor 202 of the phase-splitter tube 200. In view of the fact that the basic construction of the amplifier of FIG. 4 is in all respects identical to the basic operation and construction of the amplifier of FIG. 3, it will not be further described herein. It may be pointed out however, that the novel arrangement described herein for obtaining equal drive to a series-connected push-pull output stage is not limited to the phase-splitter circuit configuration shown in FIG. 3 and FIG. 4 but indeed may be also used with other types of vacuum tube driver circuits designed to deliver an output signal having two components of equal magnitude and opposite phase.

It is also believed apparent that many changes could be made in the above amplifier circuits and many seemingly different embodiments of the invention constructed without departing from the scope thereof. For example, different types of electronic voltage regulators could be substituted for the regulators 39 and 40, while other arrangements for producing push-pull drive signals for the series-connected output tubes could be substituted for the input drive transformer and phase-splitter tube illustrated. Furthermore, it will be understood that the push-pull input signals for driving the series-connected output tubes could be applied between the anode and the control-grid of each output tube rather than between the cathode and the control-grid as illustrated. This may be accomplished, for example, in the circuit of FIG. 3 of the drawings by the simple expedient of coupling the anode 201 of phase-splitter tube 200 to the control-grid 36 of output tube 11 instead of to the control-grid 30 of the output tube 10 and by coupling the cathode 210 of the phase-splitter tube to the control-grid 30 of output tube 10 instead of to the control-grid 36 of output tube 11. When this is done, the signal appearing across anode resistance 202 will be applied between the anode 13 and the control-grid 36 of lower tube 11, while the signal appearing across cathode resistance 211 will be applied between the control-grid 30 and the anode 14 of upper tube 10. A consequence of this modification is that the feedback signals derived from the junction of resistors 90 and 91 may be applied to the control-grid 234 of input tube 219 rather than to the cathode 220 of the tube as illustrated. This follows because of the extra phase reversal obtained during the passage of the signal through the amplifier stages. Accordingly, it is intended that all matter contained in the above description or shown in the accompanying drawings shall be interpreted as illustrative and not in a limiting sense.

What is claimed is:

1. A series-connected, push-pull amplifier circuit comprising a pair of electron space-discharge devices, each having at least an anode, a cathode and a screen-grid; means for connecting the cathode of one of said devices to the anode of the other of said devices; means for connecting a source of supply voltage between the anode of said one device and the cathode of said other device; means for coupling a load between the anode and the cathode of said other device, so that said devices are adapted to alternately conduct to energize said load upon the application of a push-pull input signal to the devices; series type electronic voltage regulator means connected between the cathode and screen-grid of said one device and having the regulated output means thereof connected in series between said source of supply voltage and the screen-grid of said one device for maintaining the screen-grid to cathode voltage of said one device substantially constant in magnitude, whereby the anode circuit efficiency of said one device is substantially unaffected by changes in frequency of said push-pull input signal and impedance of said load and the power output of said one device is thereby increased.

2. A series-connected, push-pull amplifier circuit comprising first and second electron space-discharge devices, each having at least anode and cathode elements, a control grid and a screen-grid; means for connecting the cathode of said first device to the anode of said second device to form a circuit junction therewith; means for connecting a source of anode voltage between the anode of said first device and the cathode of said second device; means for coupling a load between said circuit junction and the cathode of said second device, so that said devices are adapted to alternately conduct to energize said load upon the application of a push-pull input signal to the devices; a first series type electronic voltage regulator means connected to said source of anode voltage and having the regulated output means thereof connected in series between the screen-grid of said second space-discharge device and said source of anode voltage for maintaining the screen-grid to cathode voltage of said second device substantially constant in magnitude and higher than the anode to cathode voltage of said second device; a second series type electronic voltage regulator means having the input thereof connected to a source of supply voltage greater in magnitude than said source of anode voltage and having the regulated output means thereof connected in series between the screen-grid of said first space-discharge device and said source of supply voltage for maintaining the screen-grid to cathode voltage of said first device substantially constant in magnitude, higher than the anode to cathode voltage of said first device, and essentially equal in magnitude to the screen-grid to cathode voltage of said second device; and means for producing push-pull input signals for driving said space-discharge devices, said last named means having a separate output for the input signal of each of said devices, each of said outputs being coupled to the control grid of the device associated therewith, whereby each of said devices is adapted to be equally driven with maximum anode circuit efficiency, so that maximum power output and freedom from distortion are obtained in the amplifier circuit.

3. A series-connected, push-pull amplifier circuit as claimed in claim 2, wherein said last named means for producing the push-pull input signals comprises an input transformer having a primary winding for receiving a signal from a single-ended device and a pair of secondary windings for producing the push-pull signals.

4. A series-connected, push-pull amplifier circuit as claimed in claim 2, wherein said last-named means for producing the push-pull input signals comprises a third electron space-discharge device having at least an anode, a cathode and a control grid, an anode impedance having one end thereof connected to the anode of said third device, and a cathode impedance having one end thereof connected to the cathode of said third device, means for applying an input signal to the grid of said third device, and means for taking an output signal off across the said anode and cathode impedances for application to the control grid of a respective one of said first and second devices.

5. A series-connected, push-pull amplifier circuit as claimed in claim 4, wherein the other end of said anode impedance is connected to said circuit junction through the output of said second electronic voltage regulator, so that the anode voltage for said third space-discharge device is obtained from the output of said second voltage regulator.

6. A series-connected, push-pull amplifier circuit comprising first and second electron space-discharge devices, each having at least an anode, a cathode and a control grid; means for connecting the cathode of said first device to the anode of said second device; means for connecting a source of anode voltage between the anode of said first device and the cathode of said second device; means for coupling a load between the anode and the cathode of one of said devices, so that said devices are adapted to alternately conduct to energize said load upon the application of a push-pull input signal to the devices; a phase-splitter circuit for converting a single-ended input signal into a push-pull input signal for driving said space-discharge devices, said phase-splitter circuit comprising a third electron space-discharge device having at least an anode, a cathode and a control grid, an anode impedance having one end thereof connected to the anode of said third device, and a cathode impedance having one end thereof connected to the cathode of said third device; means for coupling the cathode of said third device to the control grid of said second device; means for connecting the other end of said cathode impedance to the cathode of said second device; means for coupling the anode of said third device to the control grid of said first device; and a series type electronic voltage regulator connected between the voltage supply source and the cathode of said first device and having the regulated output means thereof serially connected between said voltage supply source and the other end of said anode impedance, whereby said first and second space-discharge devices are adapted to be equally driven to provide a balanced output for the amplifier circuit substantially unaffected by changes in frequency of said push-pull input signal.

7. A series-connected, push-pull amplifier circuit comprising first and second electron space-discharge devices, each having at least an anode, a cathode and a control grid; means for connecting the cathode of said first device to the anode of said second device; means for connecting a source of anode voltage between the anode of said first device and the cathode of said second device; means for coupling a load between the anode and the cathode of said second device, so that said devices are adapted to alternately conduct to energize said load upon the application of a push-pull input signal to the devices; a phase-splitter circuit for converting a single-ended input signal into a push-pull input signal for driving said space-discharge devices, said phase-splitter circuit comprising a third electron space-discharge device having at least an anode, a cathode and a control grid, an anode impedance having one end thereof connected to the anode of said third device, and a cathode impedance having one end thereof connected to the cathode of said third device; means for coupling the cathode of said third device to the control grid of said second device; means for connecting the other end of said cathode impedance to the cathode of said second device, so that a signal appearing across said cathode impedance is applied between the control grid and the cathode of said second device; means for coupling the anode of said third device to the control grid of said first device; a series type electronic voltage regulator means connected between a voltage supply source and the cathode of said first device, said electronic voltage regulator means comprising fourth and fifth electron space-discharge devices, each having at least an anode, a cathode and a control grid, said fourth device being serially coupled by the anode and cathode thereof between the voltage supply source and the other end of said anode impedance to control the voltage thereto, said fifth device being connected to sense the voltage at the other end of said anode impedance and coupled to the control grid of said fourth device for control thereof in response to variations in the magnitude of the said voltage, so that a signal appearing across said anode impedance is applied between the control grid and the cathode of said first device, whereby said first and second space-discharge devices are adapted to be equally driven to provide a balanced output for the amplifier circuit substantially unaffected by changes in frequency of said push-pull input signal.

8. A series-connected, push-pull amplifier circuit as claimed in claim 7, further comprising means to equally biasing the control grids of said first and second space-discharge devices relative to the cathodes thereof, the biasing means for said first device including a voltage divider circuit connected between the cathodes of said first and second devices, said voltage divider circuit having at least a portion thereof formed by a variable impedance element having a non-linear voltage-current characteristic.

9. A series-connected, push-pull amplifier circuit as claimed in claim 7, wherein each of said first and second space-discharge devices is of the type having a screen-grid, and wherein means are provided for connecting the output of said electronic voltage regulator between the screen-grid and the cathode of at least said first device.

10. A series-connected, push-pull amplifier circuit as claimed in claim 9, further comprising a second electronic voltage regulator having the regulated output thereof connected between the screen-grid and the cathode of said second device.

11. A series-connected, push-pull amplifier circuit as set forth in claim 1, wherein a second separate series type electronic voltage regulator means is connected between the cathode and screen-grid of said other device, said second series type voltage regulator means having the regulated output means thereof connected in series between said source of supply voltage and the screen-grid of said other device for maintaining the screen-grid to cathode voltage of said other device substantially constant in magnitude.

12. A series-connected, push-pull amplifier as set forth in claim 11 wherein said supply voltage source includes a separate source for each of said separate series type electronic voltage regulators, the source for the regulator for said other device being at a potential substantially the same as the anode to cathode potential for the series connected pair of devices, and the source for the regulator for said one device being at a potential which is greater than the anode to cathode potential for the series connected pair of devices, and means for causing each regulator to maintain the screen-grid of the device associated therewith at a higher potential than the anode of the respectively associated device to further increase the anode efficiency of each of said devices and the power output of the amplifier circuit.

13. A series-connected, push-pull amplifier circuit as set forth in claim 11 wherein each of said separate, series-type electronic regulator circuits comprises third and fourth electron space-discharge devices, each of said third and fourth devices having at least an anode, a cathode, and a control electrode, means for connecting the anode and cathode of the third device of each said regulator in series between the supply voltage source and the respectively connected screen-grid of the said one and the said other devices, means for connecting the control grid of the fourth device of each said regulator to sense the variations of voltage magnitude at the screen grid of the respectively connected said one and said other device to which the third device of the respective regulator is connected, and means for connecting each fourth device to a respective third device to control the resistance thereof.

References Cited in the file of this patent

UNITED STATES PATENTS

| | | |
|---|---|---|
| 2,302,900 | Vance | Nov. 24, 1942 |
| 2,802,907 | Peterson et al. | Aug. 13, 1957 |

FOREIGN PATENTS

| | | |
|---|---|---|
| 326,922 | Great Britain | Mar. 27, 1930 |